(12) United States Patent
Melanson et al.

(10) Patent No.: US 7,242,326 B1
(45) Date of Patent: Jul. 10, 2007

(54) SAMPLE RATE CONVERSION COMBINED WITH FILTER

(75) Inventors: John L. Melanson, Austin, TX (US); Stephen Alan Turk, Longmont, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/318,271

(22) Filed: Dec. 23, 2005

(51) Int. Cl.
*H03M 7/00* (2006.01)
(52) U.S. Cl. ...................................................... 341/61
(58) Field of Classification Search ................ 341/61, 341/50, 143; 375/350
See application file for complete search history.

(56) References Cited

U.S. PATENT DOCUMENTS

| | | | |
|---|---|---|---|
| 5,392,348 A * | 2/1995 | Park et al. ................... | 379/386 |
| 5,500,874 A | 3/1996 | Terrell | |
| 5,808,924 A * | 9/1998 | White ........................ | 708/313 |
| 5,815,102 A | 9/1998 | Melanson | |
| 6,150,969 A | 11/2000 | Melanson | |
| 6,184,756 B1 * | 2/2001 | Tanaka et al. .............. | 332/103 |
| 6,480,129 B1 | 11/2002 | Melanson | |

OTHER PUBLICATIONS

"Design of IIR Filters" (Samir V. Ginde & Joseph A.N. Noronha), Virginia Polytechnic and State University, (www.ee.vt.edu/~jnoronha/dsp_proj2_report.pdf), undated.
"Infinite Impulse Response" (http://en.wikipedia.org/wiki/Infinite_impulse_response) from Wikipedia, the free encyclopedia, undated.

* cited by examiner

*Primary Examiner*—Brian Young
(74) *Attorney, Agent, or Firm*—Robert Platt Bell; Steven A. Lin

(57) ABSTRACT

Digital filtering and sample rate conversion blocks are combined in order to reduce hardware and/or computational complexity. A novel filter design is used to perform sample rate conversion. The filter may be combined with another digital filter. Two embodiment may be used to achieve this function. In a first embodiment, the filter may be clocked at a first (i.e., input) data rate (i.e., before rate conversion). In a second embodiment, the filter may be clocked at the second (i.e., output) data rate (i.e., after rate conversion). In both cases, the filter's basic structure remains essentially the same, but some extra terms are added to handle the rate conversion. The present application is directed toward a sample-rate conversion filter using the output data rate clock as the filter clock.

44 Claims, 15 Drawing Sheets

SAMPLE RATE CONVERSION COMBINED WITH FILTER

FIELD OF THE INVENTION

The present invention relates to a method and apparatus for performing sample rate conversion. In particular, the present invention is directed toward a technique and apparatus for combining digital sample rate conversion with digital filtering.

BACKGROUND OF THE INVENTION

Sample-rate conversion (SRC) refers to the process of translating a sequence of discrete data samples with a certain sampling rate into another sequence with a different sampling rate, while preserving the information contained in the original sequence. Sample rate conversion can be a relatively simple technique where the two sample rates are related by a fairly small integer ratio. For example, if the ratio of sample rates is 4:5, the input signal only needs to be upsampled by a factor of four and then, after appropriate filtering, down-sampled by a factor of five.

FIG. 1 illustrates an example of such a Prior Art sample rate conversion technique. In this Prior Art embodiment, input data may be upsampled by a factor of M in upsampler 110, to produce an upsampled data stream. Upsampling may comprise the process of creating new intermediate samples by inserting samples of value zero as intermediate values. Upsampled data may be filtered in low pass filter 120, which may comprise a digital filter. The resultant data may be downsampled by a factor of N in downsampler 130 which may decimate unwanted data samples. Downsampling may comprise decimating (eliminating) intermediate sample values to create a new sample set at the desired output sample rate.

Low pass filter 120 may be used to eliminate spectral "images" produced when upsampling. Such images are illustrated in FIG. 2. Referring to FIG. 2, the sample data at rate fs is illustrated, along with image data produced during upsampling at sample rates 2fs and 3fs. FIG. 3 illustrates how filtering may be used to eliminate undesirable images while preserving desirable data, as illustrated in FIG. 4 to produce sample rate converted data as illustrated in FIG. 5.

In the example given above for a ratio of sample rates of 4:5, M would equal 4 and N would equal 5. Such a Prior Art sample rate conversion technique may be suitable for relatively simple rate conversions. However, not all scenarios where sample rate conversion is desired have such simple sample rate ratios. For example, when converting by more drastic ratios (e.g., 124:359) the amount of processing required to upsample and then downsample may be prohibitive.

As compared to the simpler scenario where the sampling rates are related by a relatively simple ratio, the term "asynchronous sample-rate conversion" is often used to signify situations where the ratios are rather ill-defined numbers such that their least common multiple is a very large number. Asynchronous sample rate conversion is particularly applicable in cases where data is at the "same" sampling rate, but created with a different clock crystal, and thus at a slightly different sampling frequency. Thus, one set of data might have a sample rate of a "fast" 48 KHz and another might have a sample rate of a "slow" 48 KHz. Such ratios like this that are close to 1:1, but not exact, fall into the category of "asynchronous sample-rate conversion." Asynchronous sample-rate converters are commonly used when bridging two systems that are on different sampling rates and/or master operating clocks.

Additionally, in the field of audio, there are various standards that utilize different sampling rates such as 32 KHz, 44.1 KHz, 48 KHz, and so on, and sample rate converters are commonly used to interconnect different systems with the different standards.

There are times when a digital data stream needs to be converted to a different sampling frequency and in addition, be filtered in some way. One way to accomplish this task would be to have a sample rate conversion block followed by (or preceded by) a filter block. Such a setup would look like one of the block diagrams illustrated in FIG. 10. In the two Prior Art embodiments of FIG. 10, an input signal u(k) 1710 may be fed to a sample rate converter 1720 and a digital filter 1730, in either order depending upon which side of the SRC the filtering is performed. Sample rate converter 1720, as discussed previously herein, alters the sample rate of the digital input data u(k) to a different sampling rate than the input signal, and may be either synchronous or asynchronous. Digital filter 1730 may perform a number of digital filtering operations as desired by a user to alter the input signal. Output signal y(k) is thus suitably filtered and converted for a desired end use.

Applications for such sample rate conversion and digital filtering are relatively common, particularly in the digital audio arts. The Prior Art solutions of FIG. 10, while intuitive, require separate components and/or software for the digital filtering and sample rate conversion steps. Given that both functions may be required in a number of applications, it would be advantageous to combine both functions into one system, to reduce the complexity of hardware and/or software.

SUMMARY OF THE INVENTION

In the present invention, the digital filtering and sample rate conversion blocks are combined in order to reduce hardware and/or computational complexity. The present invention accomplishes both tasks using a novel filter design to perform sample rate conversion. The filter may also be used to perform other digital filtering functions, thus providing a single hardware/software technique to perform both functions.

In the present invention, the process of sample rate conversion may be combined with another digital filter. Two embodiments may be used to achieve this function. In a first embodiment, the filter may be clocked at the output data rate (i.e., the data rate after rate conversion). In a second embodiment, the filter may be clocked at the input data rate (i.e., the data rate before rate conversion). In both cases, the filter's structure is modified in a novel way to handle the rate conversion. The present application is directed toward a sample-rate conversion filter using the output data rate clock as the filter clock.

The technique of the present invention may be used to modify any low pass Infinite Impulse Response (IIR) filter with SRC modification terms to remove spectral images that are associated with sample rate conversion—without increasing the number of states in the original filter. Thus, an IIR filter used for other filtering purposes (e.g., audio processing or the like) can double as a sample rate converter, based on this invention.

The present invention includes a method of converting input data samples provided at a first sample rate to output data samples at a second sample rate unequal to the first sample rate. An IIR filter, whose internal states are updated at the second sample rate, filters the input data samples to produce output data samples at the second sample rate. If a new input sample arrives at a time differing from the update of the IIR internal states, then at least one internal state of the Infinite Impulse Response filter may be modified to account for the time difference.

In some implementations, at least one internal state of the IIR filter is modified only when the input value changes when the input arrives at a time different from the update of the IIR filter's internal states. In other implementations, at least one internal state of the IIR filter is always modified when the input arrives at a time different from the update of the IIR filter's internal states, regardless of whether the input changes value at that time.

In a preferred embodiment, the input changes value no more than once between updates of the IIR filter's internal states.

The IIR filter's internal states may comprise a vector X representing current states, vector X' representing what those states will be at the next point in time, vector U representing an input to the filter, and vector Y representing output of the filter, and matrices A, B', C, and D determine how the internal states are updated and how outputs are made from the internal states, wherein state variable descriptions are represented as $X'=AX+B'U$ $Y=CX+DU$ $X=z^{-1}X'$ wherein the B' matrix comprises a column matrix whose elements are polynomials in $z^{-1}$. Furthermore, the polynomials in the B' matrix may be of increasing degree with respect to the coefficients of $z^{-1}$.

In one embodiment, the sample rate conversion technique of the present invention may be combined with integer interpolation or decimation stages in order to achieve further sample rate conversion. This embodiment may be useful to guarantee that the input changes value no more than once between updates of the IIR filter's internal states. It may also be useful since creating a higher sampling rate into the IIR filter generally reduces the complexity or accuracy required of the SRC modification term(s).

DETAILED DESCRIPTION OF THE INVENTION

Figure 7:
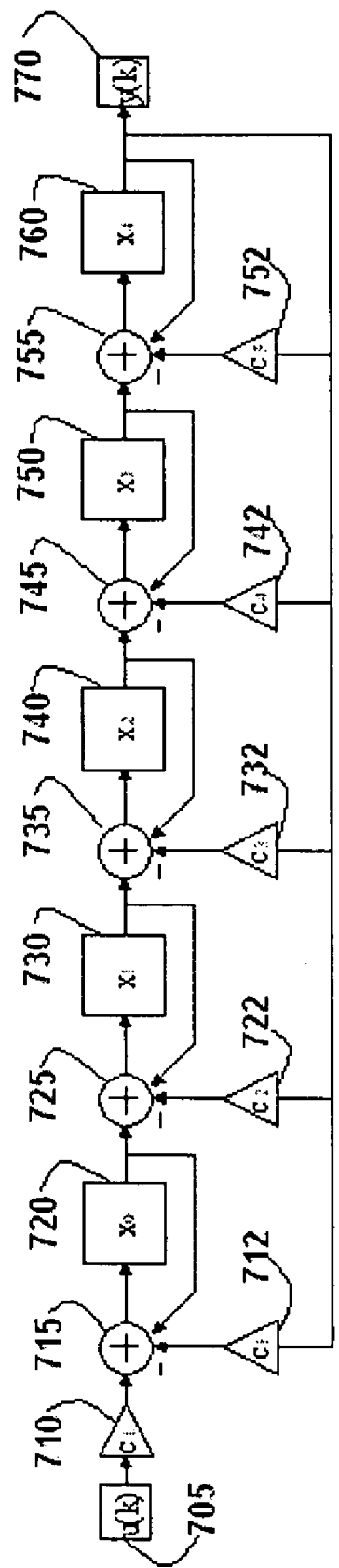
FIG. 7 is a block diagram of a 5th order Infinite Impulse Response (IIR) digital filter.

FIG. 7 is a block diagram of a 5th order Infinite Impulse Response (IIR) digital filter. IIR filters are one of two primary types of digital filters used in Digital Signal Processing (DSP) applications (the other type being Finite Impulse Response or FIR). The impulse response is "infinite" because there is feedback in the filter. If an impulse (a single "1" sample followed by many "0" samples) is input into the filter, an infinite number of non-zero values will come out (theoretically).

Basic information on the design and operation of IIR filters can be found, for example, in "DESIGN OF IIR FILTERS" (Samir V. Ginde & Joseph A. N. Noronha), Virginia Polytechnic and State University, (www.ee.vt.edu/~jnoronha/dsp_proj2_report.pdf), incorporated herein by reference. Further basic information on IIR filters can also be found at "Infinite Impulse Response" (http://en.wikipedia.org/wiki/Infinite_impulse_response) from *Wikipedia, the free encyclopedia*, also incorporated herein by reference.

Referring to FIG. 7, each of blocks 720, 730, 740, 750, and 760 ($x_0$-$x_4$) represents a unit memory delay (e.g., flip-flop). Blocks 710, 712, 722, 732, 742, and 752 ($c_1$-$c_5$) represent filter coefficients. Elements 715, 725, 735, 745, and 755 are adders, which add the feedback signals to the internal states, as modified by the corresponding filter coefficients. The output of each state is also fed back to the adder, and this "integrator topology" is common in audio applications because it has good numerical behavior with fixed-point arithmetic. Input signal u(k) 705 is input to one end of the filter and then is clocked through the flip-flops 720, 730, 740, 750, and 760, modified by the filter elements at each stage. The output signal y(k) represents the output of the filter.

In the diagram of FIG. 7, u(k) represents the incoming data, y(k) the outgoing data, and $x_0$, $x_1$, $x_2$, $x_3$, and $x_4$ are internal states (they are unit delays $z^{-1}$) so in terms of state variable description, the filter can be represented as follows:

$$X'=AX+BU$$

$$Y=CX+DU$$

$$X=z^{-1}X'$$

State variable descriptions of filters (also known as "internal descriptors") keep track of all past input history via states. The vector X represents the current states. The vector X' represents what those states will be at the next point in time. The vector U represents the input to the filter, while the vector Y represents the output of the filter. Matrices A, B, C, and D determine how the states are updated, and how the outputs are made from the internal states.

From the IIR filter in FIG. 7, the explicit matrices are:

$$A = \begin{bmatrix} 1 & 0 & 0 & 0 & -c_1 \\ 1 & 1 & 0 & 0 & -c_2 \\ 0 & 1 & 1 & 0 & -c_3 \\ 0 & 0 & 1 & 1 & -c_4 \\ 0 & 0 & 0 & 1 & 1-c_5 \end{bmatrix}$$

$$B = \begin{bmatrix} c_1 \\ 0 \\ 0 \\ 0 \\ 0 \end{bmatrix}$$

C=[0 0 0 0 1]

D=[0]

$$X = \begin{bmatrix} x_0 \\ x_1 \\ x_2 \\ x_3 \\ x_4 \end{bmatrix}$$

and U and Y are both 1×1 matrices containing the $k^{th}$ input and output.

Figure 11:
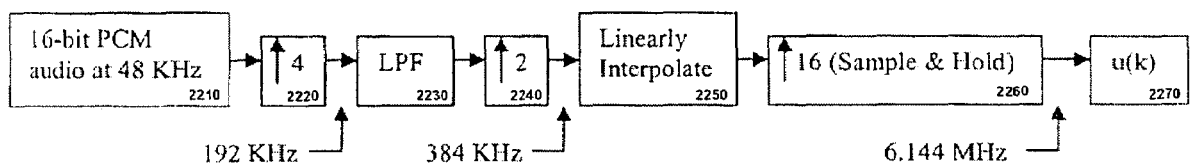
FIG. 11 is a block diagram of a processor for converting a PCM audio stream from a 48 KHz sample rate to a 6.144 MHZ ("high rate") stream.

This general filter structure can be used in a variety of ways, but in one embodiment of the present invention, the filter may be a delta-sigma modulator, where the input u(k) may be considered a "high-rate" PCM digital audio stream, and the output y(k) feeds a DAC with a low number of input bits. As used in the present application, the term "high-rate" may mean that the PCM audio might originally be sampled at 48 KHz, but for the purposes of illustration may be processed to convert it to a 6.144 MHz ("high-rate") stream. FIG. 11 is a block diagram of a processor for converting a PCM audio stream from a 48 KHz sample rate to a 6.144 MHz ("high rate") stream.

Referring to FIG. 11, 16-bit PCM audio input at 48 KHz sample rate 2210 is fed to up sampler 2220 which upsamples the signal by a factor of four to a 192 KHz sample rate. Low pass filter 2230 removes any artifacts from the upsampling process, and the signal is further upsampled in up-sampler 2240 by a factor of 2 to produce an upsampled signal at a sample rate of 384 KHz. The resultant signal is then linearly interpolated in interpolator 2250. The system may be further upsampled in sample and hold unit 2260 by a factor of 16 to produce an output signal u(k) at the desired sample rate of 6.144 MHz. The rate conversion illustrated in FIG. 11 involves only integer multiples, and is straightforward to implement. The actual method of creating the high-rate stream from the low-rate stream is immaterial; it simply illustrates this invention in the context of an audio system, as we will now demonstrate.

Figure 10:
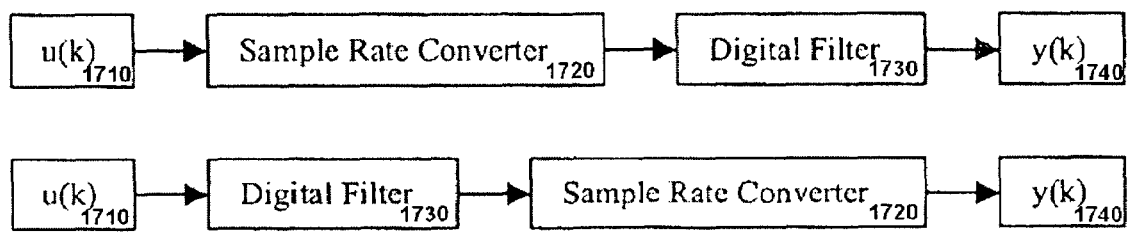
FIG. 10 is a Prior Art block diagram illustrating how sample rate conversion and digital filtering were performed as separate steps in the Prior Art.

For example, filter 1730 in FIG. 10 is an IIR filter whose inputs are the u(k) outputs of the filter of FIG. 11, and the IIR filter is clocked at 6.75 MHz. y(k) will be output at 6.75 MHz even though the sample input is only coming at 6.144 MHz. To account for the clock signal differences, the input samples can be converted to 6.75 MHz before feeding them to the filter (as shown in FIG. 10), or the rate conversion could be integrated into the IIR filter itself. Integrating rate conversion into the IIR filter is the primary objective of the present invention.

The ratio of the two aforementioned clock signals 6.75/6.144 is equal to 1125/1024, the factor by which the original data rate needs to increase to make it work with a 6.75 MHz clock. Using traditional sample rate conversion techniques, the data can be upsampled by M=1125 and after appropriate filtering, downsampled by N=1024. However, the ratio of 5/4 will be used in the present discussion for the sake of example.

In the initial examples, the high rate PCM stream is 4 MHz and the delta-sigma filter is clocked at 5 MHz. These numbers are not supposed to approximate anything in a real application, but rather to just make the example easier to follow and illustrate.

Figure 1:
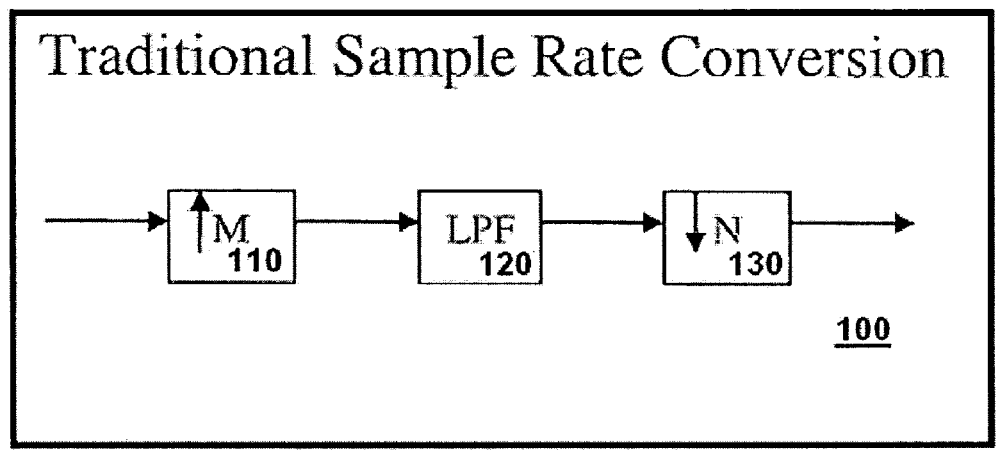
FIG. 1 is a block diagram illustrating how traditional sample rate conversion is performed.
Figure 2:
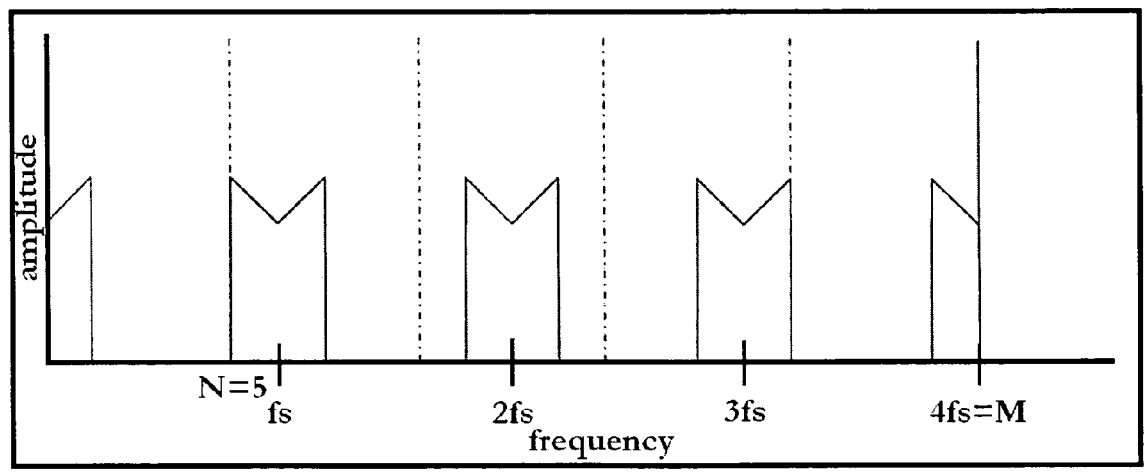
FIG. 2 is a spectrum diagram illustrating the resulting data and artifacts produced after upsampling the input digital signal.
Figure 3:
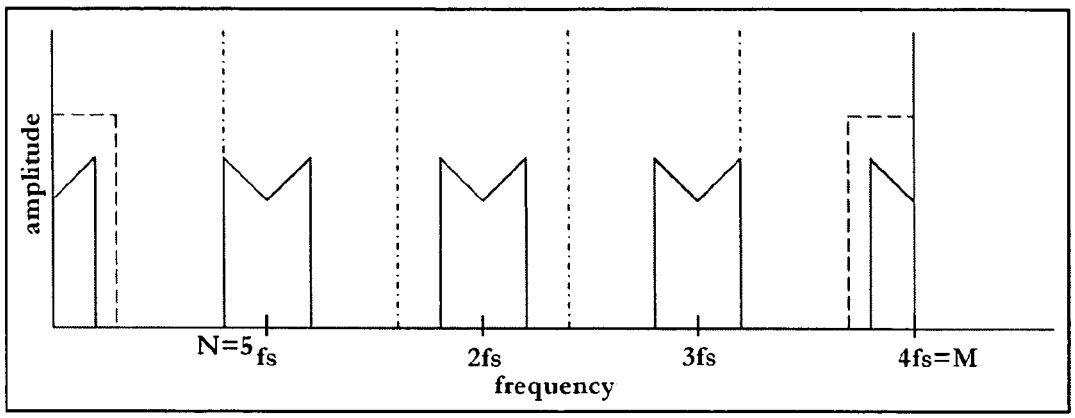
FIG. 3 is a spectrum diagram illustrating the resulting data and artifacts produced after upsampling the input digital signal, highlighting the desired data portion of upsampled digital signal.
Figure 4:
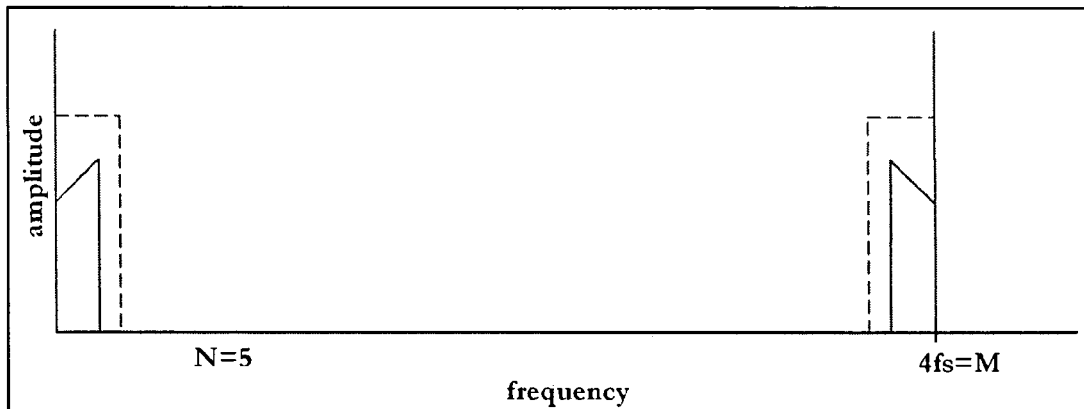
FIG. 4 is a spectrum diagram illustrating the resulting data after artifacts have been filtered out with a low pass filter.
Figure 5:
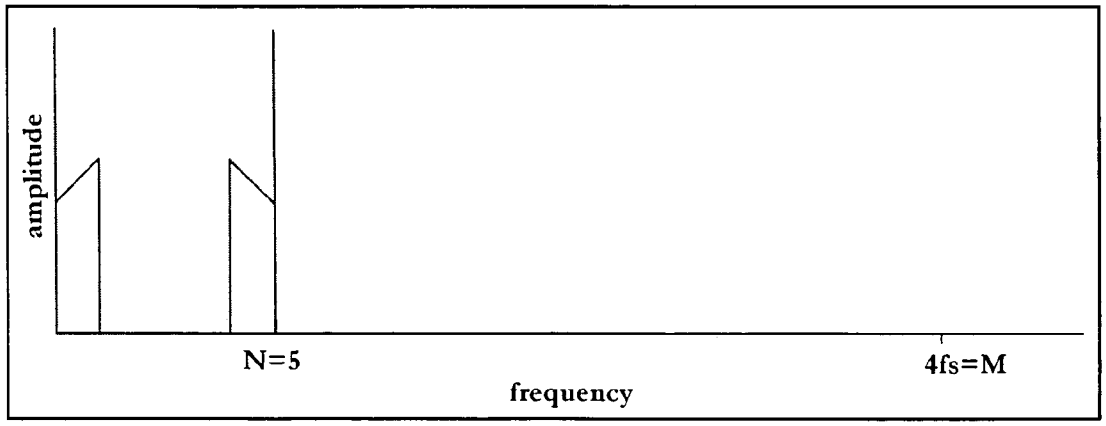
FIG. 5 is a spectrum diagram illustrating the resulting data after sample rate conversion.
Figure 6:
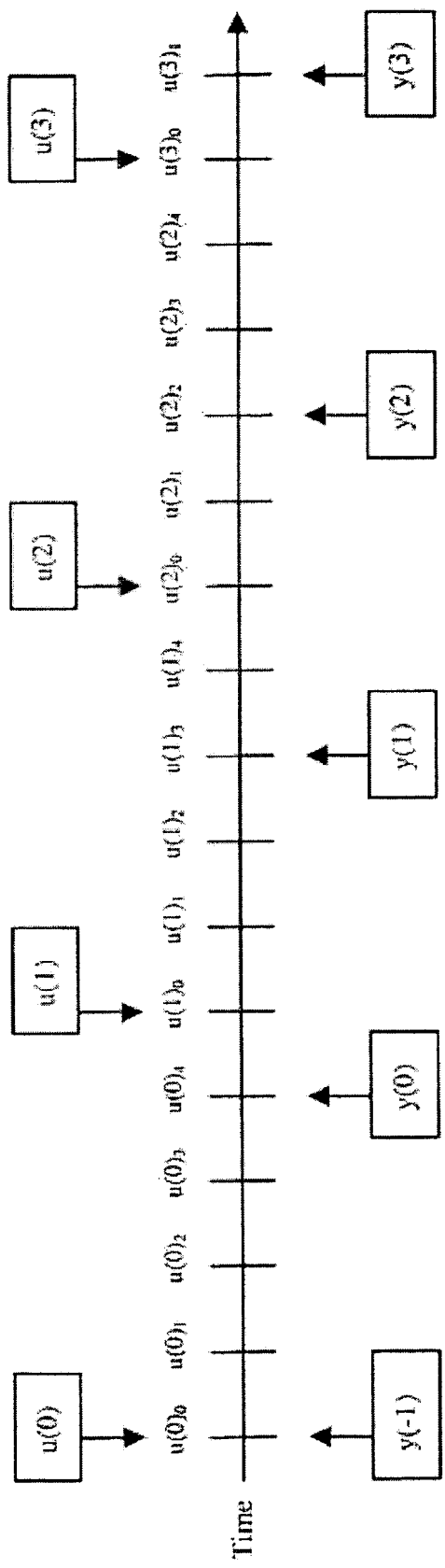
FIG. 6 is a diagram illustrating input and output sequences for a 5:4 sample rate conversion.

In FIG. 6, the u(k)'s in boxes represent the high-rate PCM data coming into the filter, while the y(k)'s in boxes represent the data coming out of the filter. The ticks on the time-line make it clear that the output rate is $5/4^{th}$ the input rate.

Furthermore, the $u(k)_j$'s that are not in boxes are a conceptual tool. In order to accomplish the rate conversion, it is hypothetically assumed that the incoming data has been sampled and held at a rate 5 times faster than the already "high-rate" PCM data. Thus, $u(k)_j$=u(k) for every j. This relationship is required to make the following mathematical derivations.

The original state variable descriptions can be represented as follows:

$$X'=AX+BU$$

$$Y=CX+DU$$

$$X=z^{-1}X'$$

Those equations describe an original system at an original sampling rate which is equivalent to a new system whose sampling frequency is 4 times as fast as the original system, when the last equation is changed to $X=z^{-4}X'$. By equivalent, it is meant that the frequency response of the original system is the same as the frequency response of the new system for all frequencies.

Figure 12:
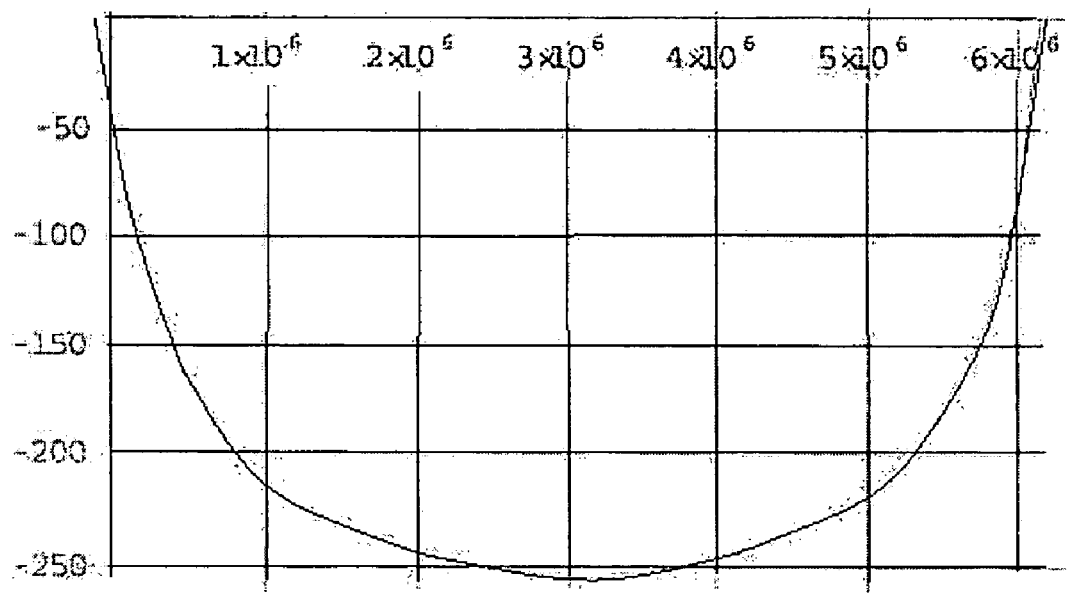
FIG. 12 is a plot from 0 to $f_s$ of the original frequency response for the example of FIG. 6.
Figure 13:
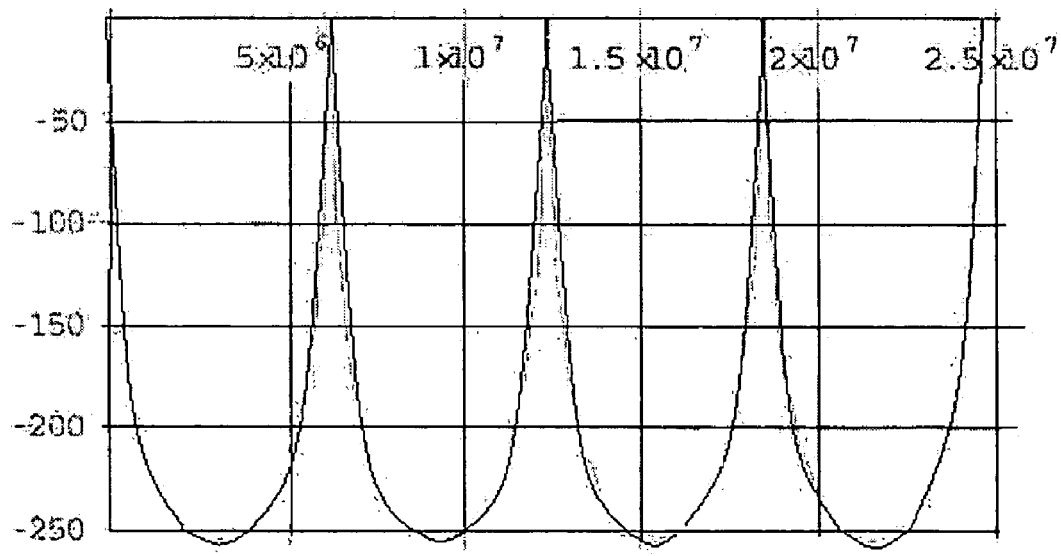
FIG. 13 is a plot from 0 to $f_s$ of the frequency response, as upsampled by 4, for the example of FIG. 6.

For example, if the original frequency response looks as depicted in FIG. 12, then upsampling by 4 gives a frequency response illustrated in FIG. 13. Both plots in FIG. 12 and FIG. 13 are from 0 to $f_s$, not $f_s/2$.

Operating as if the unit delays in the original filter of FIG. 7 were replaced by delays of 4 time units, the conceptual sample-and-held $u(k)_j$'s in FIG. 6 can be viewed as the IIR filter inputs, rather than the original $u(k)$'s.

In using the original $u(k)$'s, at the time of each output $y(k)$, the internal state variables would be updated via the equation $X'=AX+BU$. Because of the rate differences between the input $u(k)$ and the outputs $y(k)$, what the value of BU should be is unclear, as is illustrated in FIG. 6.

However, and noting again that this is a conceptual exercise, if the internal states could be updated at fractional steps in time, then the BU would not be ambiguous, as the $u(k)_j$'s could be used as inputs. Updating X' at fractional points in time is easy by taking fractional powers of the matrix A, as long as there are inputs which correspond to the fractional time spacing, Thus, a motivation is provided for the conceptual $u(k)_j$'s.

The four fractional updates between $y(k)$ and $y(k+1)$ may look as follows:

$$X_1 = A^{1/4}X_0 + BU$$

$$X_2 = A^{1/4}X_1 + BU$$

$$X_3 = A^{1/4}X_2 + BU$$

$$X_4 = A^{1/4}X_3 + BU$$

wherein $X_0$ corresponds to the time X in the original state equations and $X_4$ corresponds in time to the X' in the original state equations, and U is the relevant input for that time step. Also $X_0 = z^{-1}X1$ and $X_4 = z^{-4}X_0$ For an explicit example between $y(0)$ and $y(1)$, this means that:

$$X_1 = A^{1/4}X_0 + Bu(0)_0$$

$$X_2 = A^{1/4}X_1 + Bu(0)_1$$

$$X_3 = A^{1/4}X_2 + Bu(0)_2$$

$$X_4 = A^{1/4}X_3 + Bu(0)_3$$

From a z-transform point of view (in the conceptually upsampled domain) this may be represented as:

$$X_1 = A^{1/4}X_0 + BUz^{-3}$$

$$X_2 = A^{1/4}X_1 + BUz^{-2}$$

$$X_3 = A^{1/4}X_2 + BUz^{-1}$$

$$X_4 = A^{1/4}X_3 + BU$$

One can substitute and simplify the above equations as follows:

$$X4 = AX_0 + (A^{3/4}Bz^{-3} + A^{1/2}Bz^{-2} + A^{1/4}Bz^{-1} + B)U$$

Or, rewriting everything in the original format, yields:

$$X' = AX + (A^{3/4}Bz^{-3} + A^{1/2}Bz^{-2} + A^{1/4}Bz^{-1} + B)U$$

$$Y = CX + DU$$

$$X = z^{-4}X'$$

For a rate conversion ratio of 1:1 (i.e., no real change of rate), the above equations produce output, which differs from the regular non-modified internal state update equations. However, when properly implemented, the difference is negligible, and in fact, this invention derives a general framework for adding "SRC modification terms" to an IIR filter. There are many changes which can be made to the invention, which are done on the basis of performance requirements, but do not depart from the intent or scope of the original invention.

To simplify matters and avoid complex matrix equations, the following are some examples of the above derivation with explicit matrix values shown.

Referring back to FIG. 7, the coefficients c1, c2, c3, c4, and c5 (712, 722, 732, 742, and 752, respectively) appear in the matrices A and B discussed previously. These coefficients determine some frequency response characteristics of the system, and one reasonably way to select them is such that the resulting filter will roll off like a Butterworth filter. The $c_i$'s can be chosen in this way to create a Butterworth response with 3 dB attenuation at 50 KHz, arbitrarily chosen for this example as follows:

$$A = \begin{bmatrix} 1 & 0 & 0 & 0 & -4.88599 \times 10^{-7} \\ 1 & 1 & 0 & 0 & -2.9624 \times 10^{-5} \\ 0 & 1 & 1 & 0 & -8.83552 \times 10^{-4} \\ 0 & 0 & 1 & 1 & -1.61107 \times 10^{-2} \\ 0 & 0 & 0 & 1 & 1-1.890095 \times 10^{-1} \end{bmatrix}$$

$$B = \begin{bmatrix} 4.88599 \times 10^{-7} \\ 0 \\ 0 \\ 0 \\ 0 \end{bmatrix}$$

Next, fractional powers of A need to be considered with the new X' developed. Fractional powers are required to update some state variables. Here is $A^{3/4}$:

$$A^{3/4} = \begin{bmatrix} 1 & 1.20768 \times 10^{-8} & -2.11379 \times 10^{-8} & 4.94252 \times 10^{-8} & -3.7503 \times 10^{-7} \\ 0.75 & 1 & -1.26953 \times 10^{-6} & 2.97554 \times 10^{-6} & -2.26882 \times 10^{-5} \\ -0.093764 & 0.750021 & 0.999962 & 8.81081 \times 10^{-5} & -6.75188 \times 10^{-4} \\ 0.0388109 & -0.0933658 & 0.749324 & 1.00159 & -0.0122775 \\ -0.0247171 & 0.0432624 & -0.101157 & 0.767542 & 0.863361 \end{bmatrix}$$

The first column of $A^{3/4}$ (or any of the fractional powers of A for that matter) is relevant, as the multiplication with B picks off the first column. If instead of using A with the $c_j$ feedback terms, A is used without them. Here is A without the $c_j$'s:

$$A = \begin{bmatrix} 1 & 0 & 0 & 0 & 0 \\ 1 & 1 & 0 & 0 & 0 \\ 0 & 1 & 1 & 0 & 0 \\ 0 & 0 & 1 & 1 & 0 \\ 0 & 0 & 0 & 1 & 1 \end{bmatrix}$$

And here is the fractional power for this modified A:

$$A^{3/4} = \begin{bmatrix} 1 & 0 & 0 & 0 & 0 \\ 0.75 & 1 & 0 & 0 & 0 \\ -0.09375 & 0.75 & 1 & 0 & 0 \\ 0.0390625 & -0.09375 & 0.75 & 1 & 0 \\ -0.0219727 & 0.0390625 & -0.09375 & 0.75 & 1 \end{bmatrix}$$

Comparing the first column of this matrix with the first column of the other $A^{3/4}$ matrix above, the values are seen as "close." The meaning of "close" is ultimately determined by the performance of the SRC, namely the attenuation of spectral images. Therefore, the feedback terms when calculating partial powers of the A matrix are not always eliminated. However, a fundamental concept of this invention, namely finding suitable approximations for complex calculations, is illustrated. To help ensure that the transfer function will be optimal, the feedback coefficients must remain. In some cases, the feedback coefficients are not relevant; in other cases, they are.

For the present example, the approximation gives sufficient amount of attenuation. Thus, the following matrices are fractional powers of the A matrix without the $c_j$'s:

$$A^{1/2} = \begin{bmatrix} 1 & 0 & 0 & 0 & 0 \\ 1/2 & 1 & 0 & 0 & 0 \\ -1/8 & 1/2 & 1 & 0 & 0 \\ 1/16 & -1/8 & 1/2 & 1 & 0 \\ -5/128 & 1/16 & -1/8 & 1/2 & 1 \end{bmatrix}$$

$$A^{1/4} = \begin{bmatrix} 1 & 0 & 0 & 0 & 0 \\ 3/4 & 1 & 0 & 0 & 0 \\ -3/32 & 3/4 & 1 & 0 & 0 \\ 5/128 & -3/32 & 3/4 & 1 & 0 \\ -45/2048 & 5/128 & -3/32 & 3/4 & 1 \end{bmatrix}$$

With the above information, the equation for X' can be updated by defining a new B' as follows:

$$B' = (A^{3/4} B z^{-3} + A^{1/2} B z^{-2} + A^{1/4} B z^{-1} B)$$

And explicitly:

$$B' = \begin{bmatrix} z^{-3} + z^{-2} + z^{-1} + 1 \\ \frac{3}{4} z^{-3} + \frac{1}{2} z^{-2} + \frac{1}{4} z^{-1} \\ -\frac{3}{32} z^{-3} - \frac{1}{8} z^{-2} - \frac{3}{32} z^{-1} \\ \frac{5}{128} z^{-3} + \frac{1}{16} z^{-2} + \frac{7}{128} z^{-1} \\ -\frac{45}{2048} z^{-3} - \frac{5}{128} z^{-2} - \frac{77}{2048} z^{-1} \end{bmatrix} c_1$$

Thus, the internal state variables can be updated with X'=AX+B'U, and the elements of B' define the SRC modification terms which are applied to the original IIR filter.

The A matrix in the above state update equation does have the $c_j$'s in it (they were removed temporarily to help calculate B'). In view of the conceptually upsampled domain (where real u(k)'s only arrive every fifth conceptual time slot), the only remaining item is to figure out how to handle the intermediate time slots for which B' calls, without explicitly having to upsample. (e.g., maintaining this upsampling at a conceptual level, rather than actually implementing in hardware.)

At times, all of the intermediate samples will have the same value. Referring back to the diagram of FIG. 6 showing input samples at a rate that is 4/5 the rate of the output samples, the values of the intermediate $u(k)_j$ ("conceptual-sample-and-hold") samples between y(−1) and y(0) do not change. When the intermediate values do in fact change, there is at most one change in their value over the span of time used for updating the internal state variables (see for example the time between y(0) and y(1)).

Thus, when the values do not change, then the polynomial coefficients in B' simply get added together, multiplied by the single relevant sample value. When the values do change, one portion of the polynomials in B' gets added together, multiplied by one sample value, and the remaining portion of the polynomials gets added together, multiplied by the other sample value.

The B' matrix is in the form of a column matrix whose elements are polynomials in $z^{-1}$. The matrix entries are polynomials with coefficients that determine curves of increasing degree. The first element is a polynomial whose coefficients of $z^{-1}$ are constant (degree 0), the second element is a polynomial whose coefficient of $z^{-1}$ are linear (degree 1), the third element is a polynomial whose coefficients of $z^{-1}$ are quadratic (degree 2), and so on. The "degree" referred to here is not a maximum power of $z^{-1}$, which is 3 for all the above polynomials. Rather, the "degree" of interest is the degree of the curve that passes through the points indicated by the coefficients of the polynomials in $z^{-1}$.

These polynomials are exact for this example (with the feedback terms removed while calculating B'), but the concept is readily extended to arbitrary curve fitting. A key issue is that a curve fit to the coefficients of $z^{-1}$ in the B' matrix. The SRC performance will ultimately be determined by the quality of this curve fit. For most common filters used in audio applications, an array of polynomials of increasing degree works, but the invention should not be construed to be limited to such a case. In fact, when using table lookup, the curves need not be polynomials at all. For example, they could be exponentials. For this derivation, it is convenient to continue using polynomials.

Because of the form of the polynomials, the conceptual upsampling can be extended to an "infinite upsampling"—i.e., the polynomials become continuous curves—and the summation of pieces of those curves turns into continuous integration. When the input changes value at most once between updates of the IIR filter's internal states, a first section of the curves will be integrated and multiplied by the relevant sample value, and the remaining section of the curves will be integrated and multiplied by the other relevant sample value.

Figure 8:
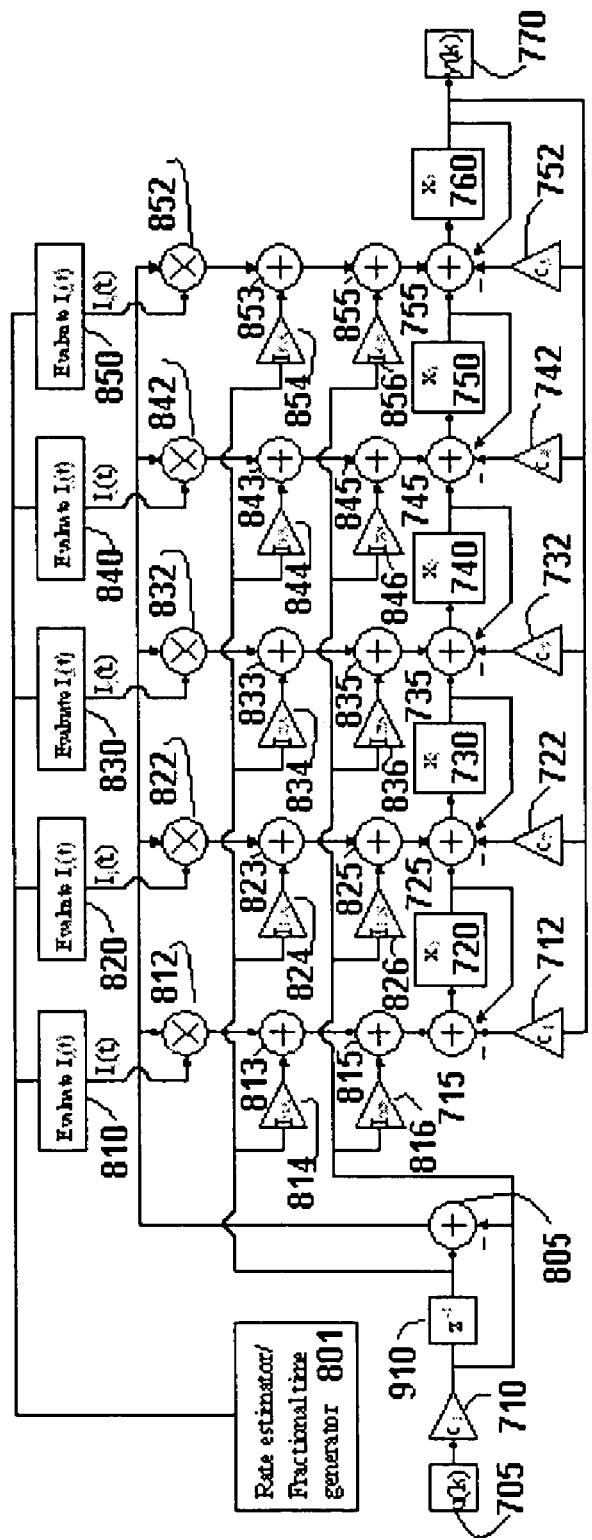
FIG. 8 is a block diagram of a modified version of the digital filter of FIG. 7 forming a sample rate converter with an IIR filter clocked at the output data rate, illustrating a first method with dedicated calculations of the modification functions based on the fractional time.
Figure 9:
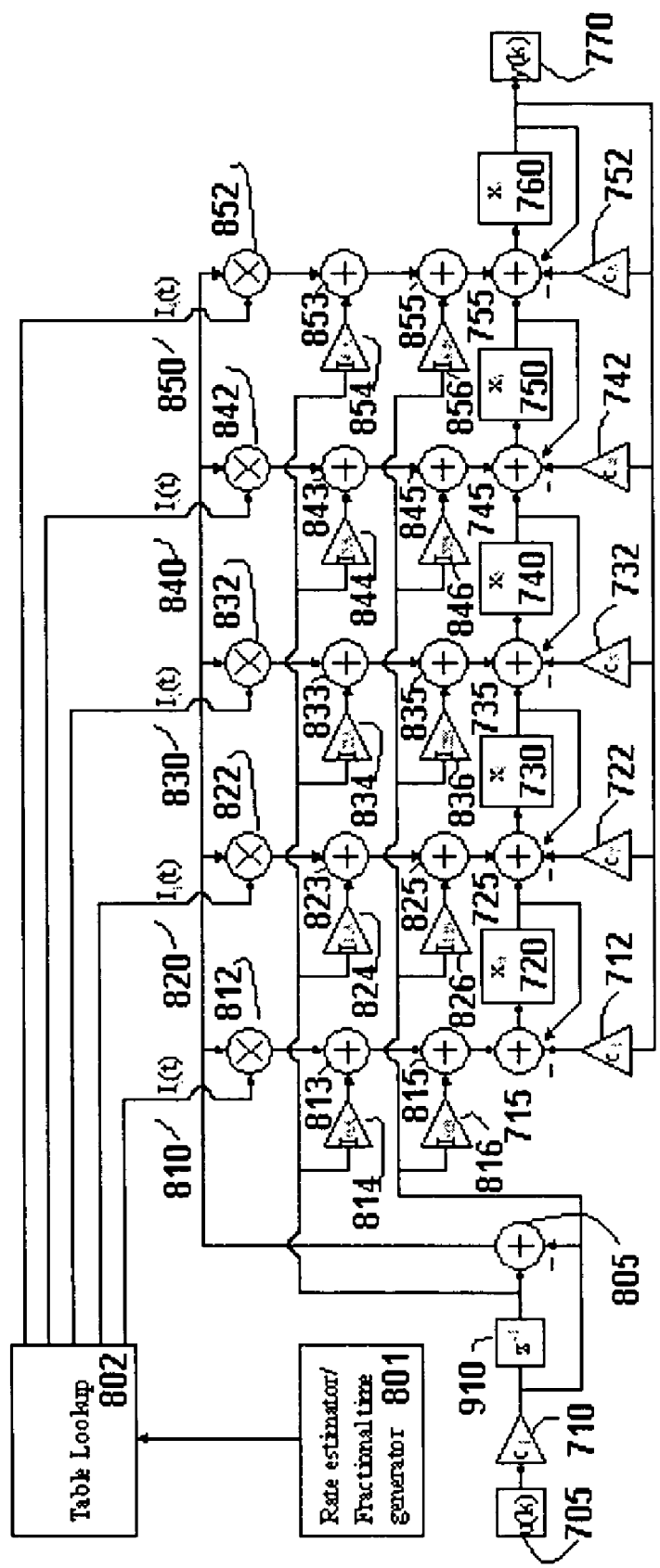
FIG. 9 is a block diagram of a modified version of the digital filter of FIG. 7 forming a sample rate converter with an IIR filter clocked at the output data rate, illustrating a second method with table lookup of the modification functions based on the fractional time.

FIGS. 8 and 9 illustrate two embodiments of the present invention with the SRC modification terms applied to an original filter. Delay element 910 operates at the input rate to provide the current and previous input samples, which are multiplied in multipliers 812, 822, 832, 842, and 852 by applicable SRC modification terms from time-varying elements 810, 820, 830, 840, and 850 and applied to the filter at its normal update rate, which is nominally different from the input rate. The polynomial curves are pre-integrated from $-\infty$ to t, where t is variable.

For example, for the B' previously derived, the continuous-time constant curve is 1, and integrating it from $-\infty$ to t gives t (plus a constant). The continuous-time linear curve is $-t$, and integrating it from $-\infty$ to t gives $-t^2/2$ (plus a constant). The continuous-time quadratic curve is $t/2+t^2/2$, and integrating it from $-\infty$ to t gives $t^2/4+t^3/6$ (plus a constant), and so on. (As will be shown shortly, the constants are not relevant because the differences of the integrated values are the ones of interest.)

When the input changes value at most once between updates of the IIR filter's internal states, then integration is performed from 0 to $\tau$ and from $\tau$ to 1—assuming $\tau$ defines the time the input arrives relative to when the IIR filter's internal states are updated—and multiply each result by the relevant input sample value. (Better performance may be obtained by integrating from $-0.5$ to $\tau$ and from $\tau$ to 0.5 because this is closer to an "identity" transformation when the rate conversion ration is 1:1.) The notation $I_i(t)$ is defined to mean the integration from $-\infty$ to t for the $i^{th}$ curve. Then the following equation must be calculated:

$$u(k)[I_i(t)-I_i(0)]+u(k+1)[I_i(1)-I_i(\tau)]=u(k+1)[I_i(1)]-u(k)[I_i(0)]+I_i(\tau)[u(k)-u(k+1)]$$

FIGS. 8 and 9 illustrate the right side of the above equation applied as SRC modification terms to the original filter. Quantities $-I_i(0)$ and $I_i(1)$ can be pre-computed for each curve, and are shown as gains 814, 824, 834, 844, 854, 816, 826, 836, 846, and 856 in FIGS. 8 and 9. The outputs of time-varying terms 810, 820, 830, 840, and 850 are fed to multipliers 812, 822, 832, 842, and 852, respectively, which in turn multiply the outputs of time-varying terms 810, 820, 830, 840, and 850 with the difference of the previous and current input samples as determined by subtractor 805. The difference of the previous and current input samples is applied to a term, which is time-varying, and must either be computed as driven by fractional time generator/rate estimator 801 each time as in FIG. 8, or looked up in a table 802 as in FIG. 9. The time-varying terms are 810, 820, 830, 840, and 850 in the FIGS. 8 and 9. Adders 813, 823, 833, 843, 853, 815, 825, 835, 845, and 855 add the corresponding terms of the right-hand portion of the equation above.

As previously mentioned, the invention is not limited to handling just one change in input value per update of the filter's internal states. However, imposing such a constraint can make implementation easier. If more than one input change is allowed per filter update time, then more regions of integration are required, along with more delay elements, and more adders and multipliers.

Furthermore, as will be shown later, it may be possible to eliminate or simplify some of the modification terms, and still achieve the desired performance.

The above paragraphs derive the math for doing sample rate conversion inside the original filter. From a state description of a filter one can calculate the transfer function by:

$$H(z)=C(zI-A)^{-1}B+D$$

The above equation is very general, and it does not matter what form any of the matrices are in. A very specific set of matrices was previously presented, where B has only one nonzero element, and it is in the first position. Consider the equation for H(z) when B is a general column matrix. In that case, the equation can be rewritten:

$$H(z)=C(zI-A)^{-1}B_0+C(zI-A)^{-1}B_1+C(zI-A)-1B_2+C(zI-A)^{-1}B_3+C(zI-A)^{-1}B_4+D$$

(This is for a B matrix with five elements, numbered 0 through 4.)

B has now been separated into five pieces (which is valid because of matrix math properties), each with only one nonzero element. For example, $B_0$ has the first element from B in the first location and zeros everywhere else. $B_1$ has the second element of B in the second position and zeros everywhere else, and so on. Thus, to calculate the overall transfer function, the individual transfer functions can be calculated based on which state the input goes into, and then by adding the individual transfer functions together. (D is zero for this case, but if it were not, then it could be added to the end as shown above.)

This way of calculating is useful because the B' created has nonzero elements in each position. To calculate the overall transfer function of the entire SRC, the following equation needs to be calculated:

$$H(z)=C(zI-A)^{-1}B'+D$$

This calculation can be sub-divided. For example, instead of using the B' derived above (with the polynomials), a B that contains a single "1" in each position can be used. This sub-division of calculations will create individual transfer functions that represent what happens when an input goes into each one of the states. Furthermore, the transfer functions can be calculated for each of the polynomials in the B' matrix. (In other words, those transfer functions are simply the polynomials themselves.) The product of these two transfer functions (for each state) gives the overall transfer functions for an input going into each state. The sum of those products gives the overall transfer function for the entire SRC filter.

Figure 14:
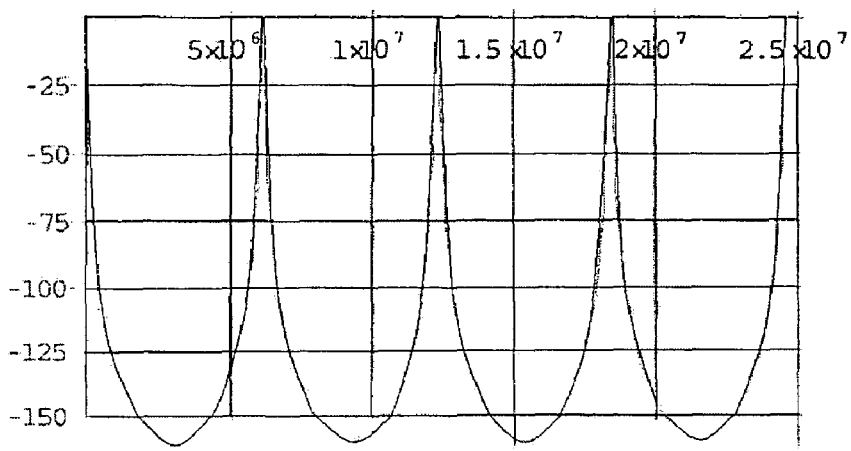
FIG. 14 is a frequency response diagram for $H_0$.
Figure 15:
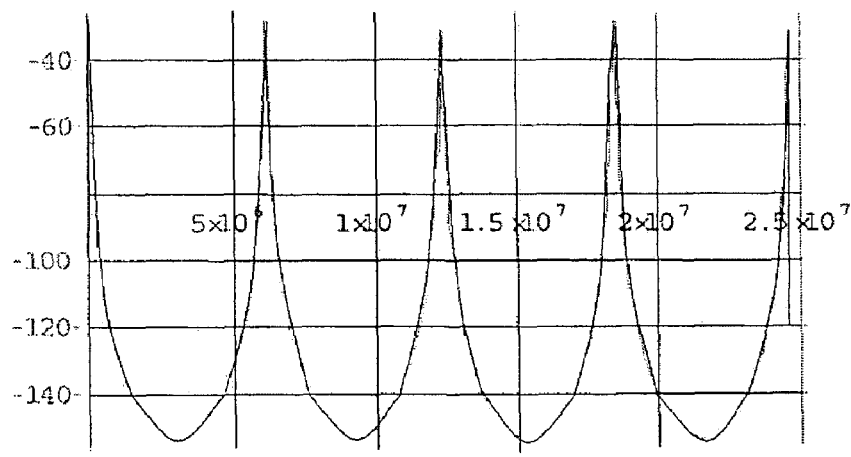
FIG. 15 is a frequency response diagram for $H_1$.
Figure 16:
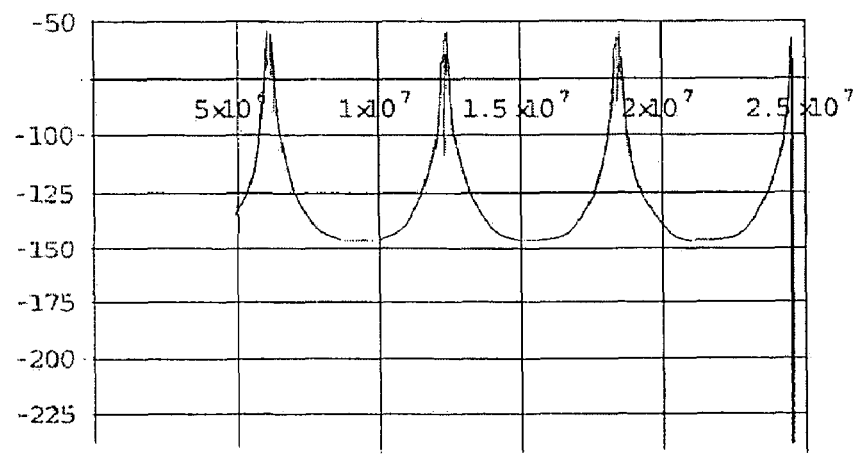
FIG. 16 is a frequency response diagram for $H_2$.
Figure 17:
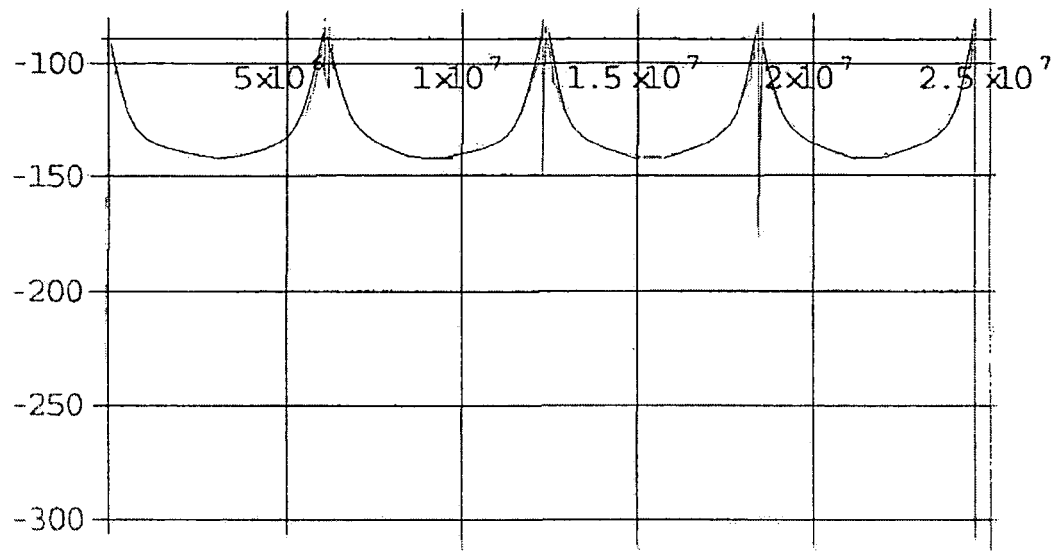
FIG. 17 is a frequency response diagram for $H_3$.
Figure 18:
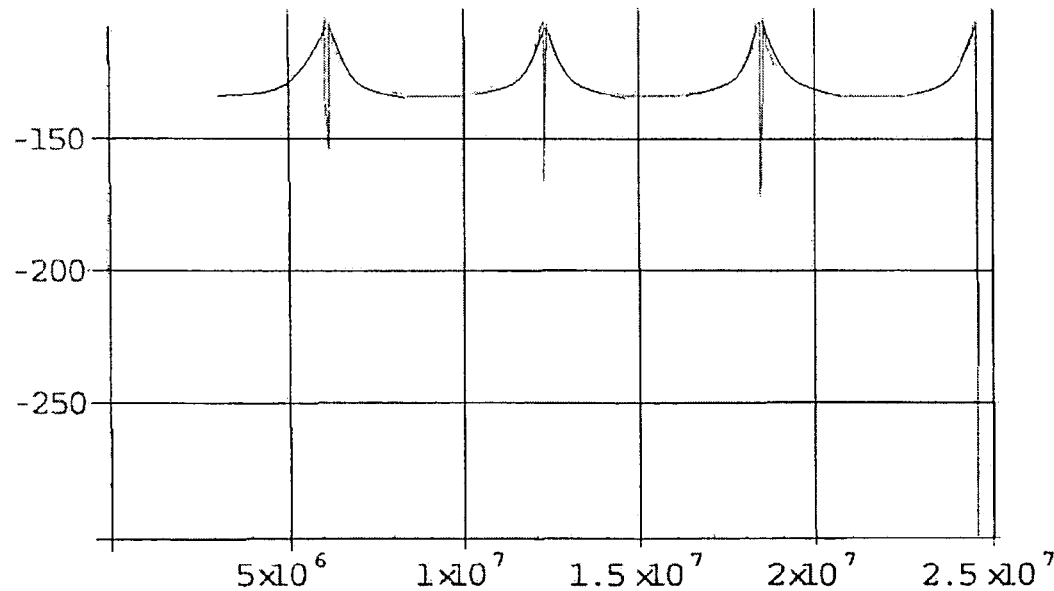
FIG. 18 is a frequency response diagram for $H_4$.

FIGS. 14-18 illustrate the operation of the SRC filter. For the individual transfer functions for an input into each state (states numbered 0 through 4, and $H_i$ representing the transfer function for an input into the ith state), yields the following responses. FIG. 14 is a frequency response diagram for $H_0$. FIG. 15 is a frequency response diagram for $H_1$. FIG. 16 is a frequency response diagram for $H_2$. FIG. 17 is a frequency response diagram for $H_3$. FIG. 18 is a frequency response diagram for $H_4$.

Figure 19:
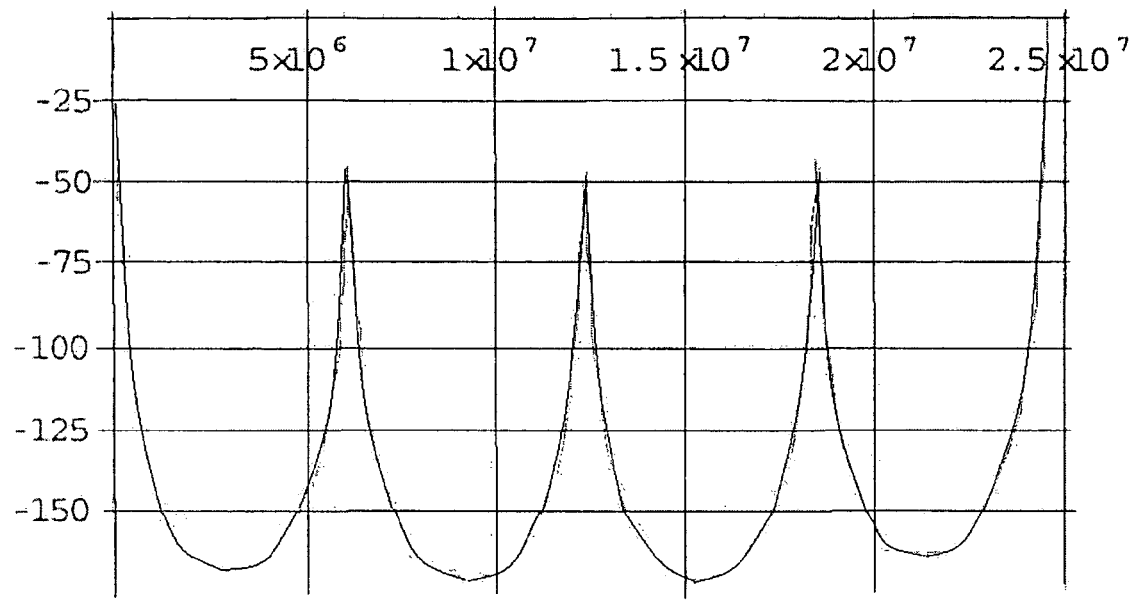
FIG. 19 is a plot of the product of transfer functions $H_0P_0$.
Figure 20:
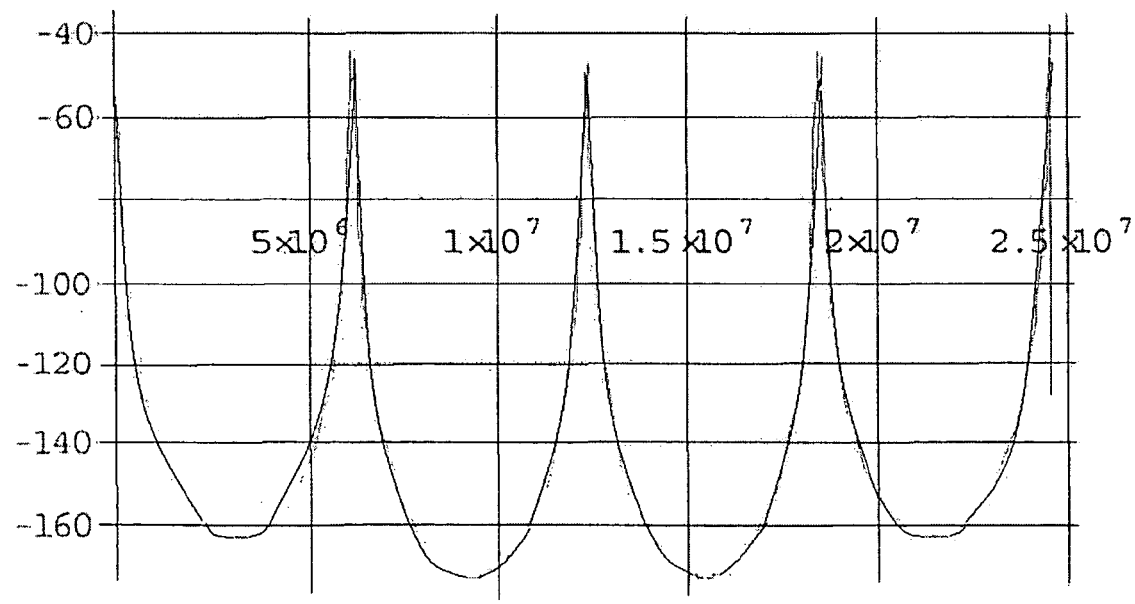
FIG. 20 is a plot of the product of transfer functions $H_1P_1$.
Figure 21:
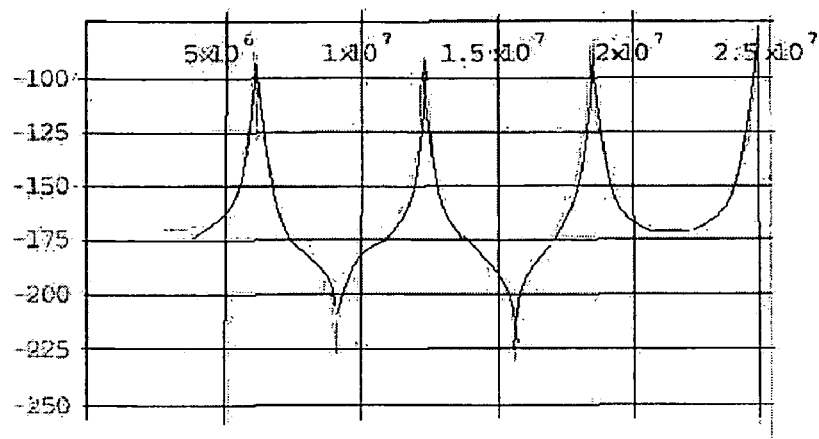
FIG. 21 is a plot of the product of transfer functions $H_2P_2$.
Figure 22:
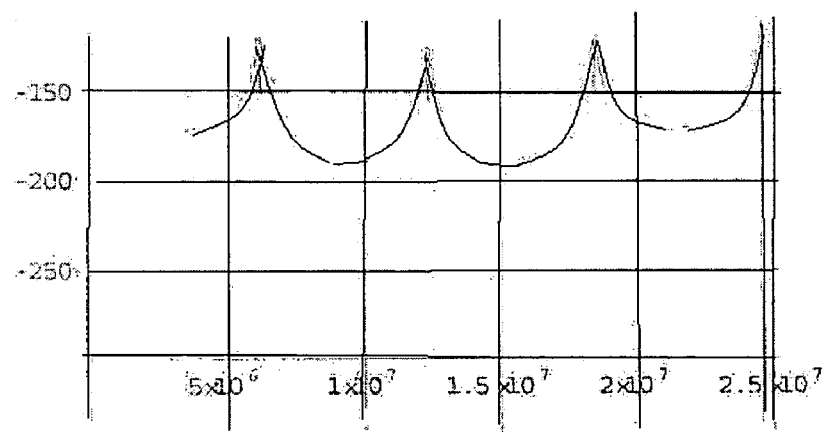
FIG. 22 is a plot of the product of transfer functions $H_3P_3$.
Figure 23:
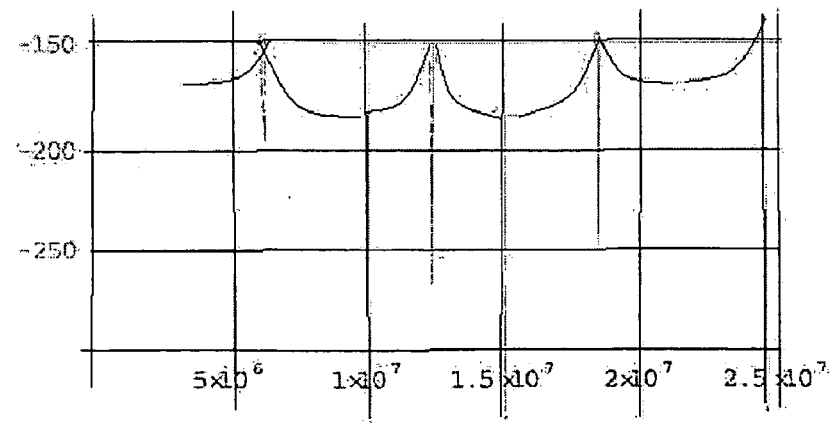
FIG. 23 is a plot of the product of transfer functions $H_4P_4$.
Figure 24:
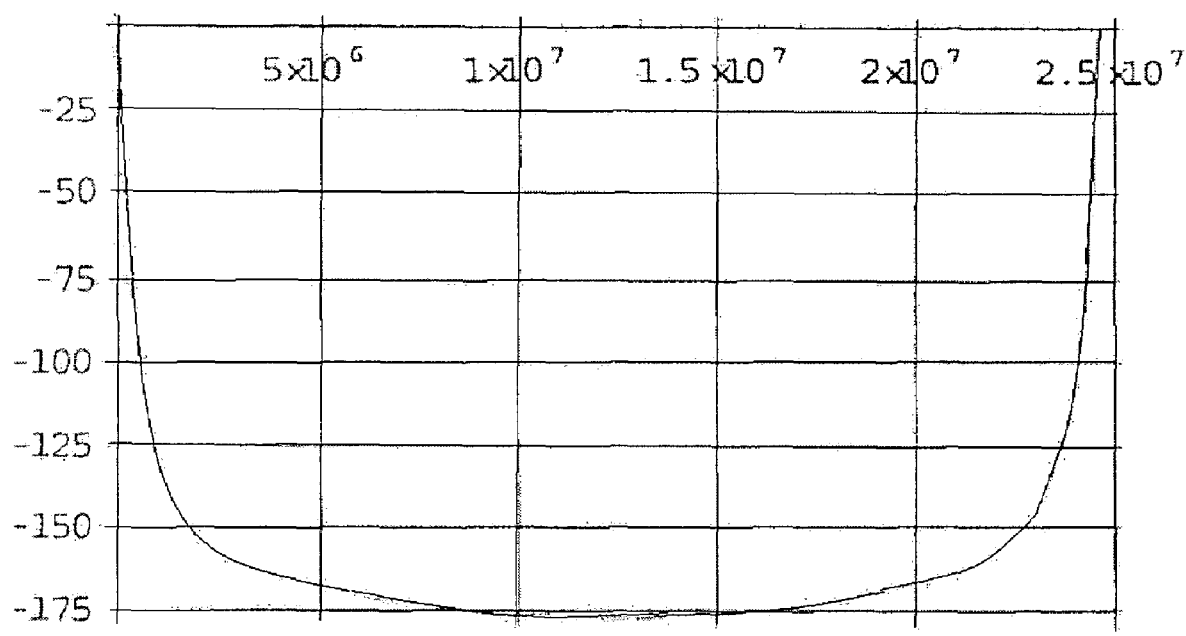
FIG. 24 is the sum of the above transfer functions of FIGS. 19-23.

FIG. 19 is a plot of the product of transfer functions $H_0P_0$. ($P_i$ represents the ith polynomial.) FIG. 20 is a plot of the product of transfer functions $H_1P_1$. FIG. 21 is a plot of the product of transfer functions $H_2P_2$. FIG. 22 is a plot of the product of transfer functions $H_3P_3$. FIG. 23 is a plot of the product of transfer functions $H_4P_4$. FIG. 24 is the sum of the above transfer functions of FIGS. 19-23.

Figure 25:
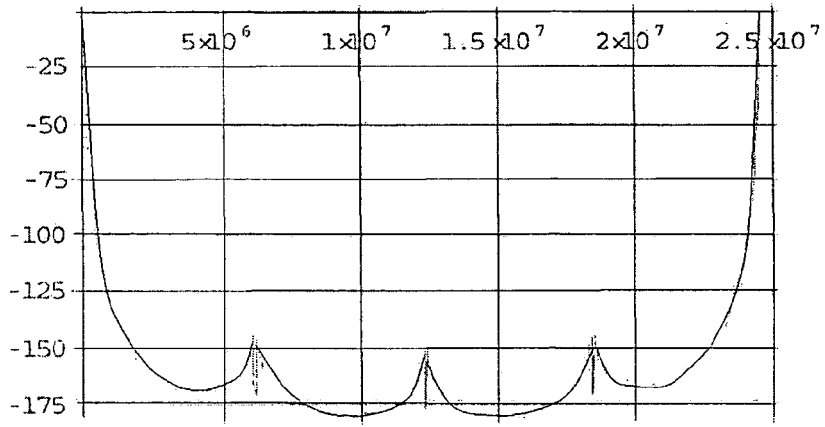
FIG. 25 illustrates the overall transfer function in FIG. 24 with the polynomial modifier of highest degree removed.
Figure 26:
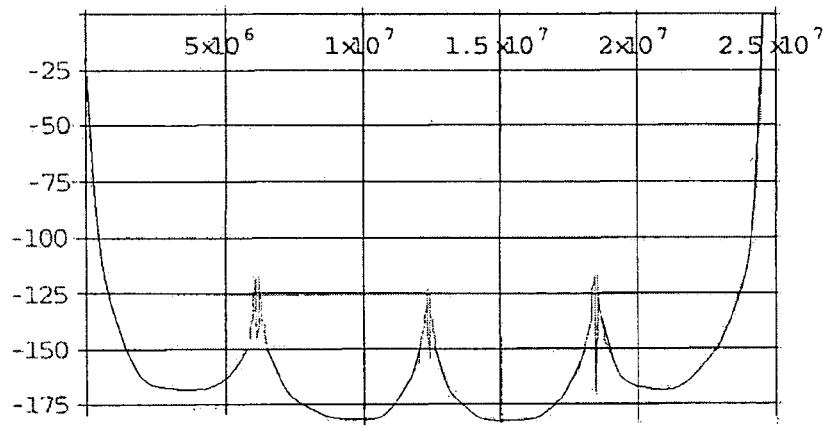
FIG. 26 illustrates the overall transfer function in FIG. 24 with the two highest degree polynomial modifiers removed.
Figure 27:
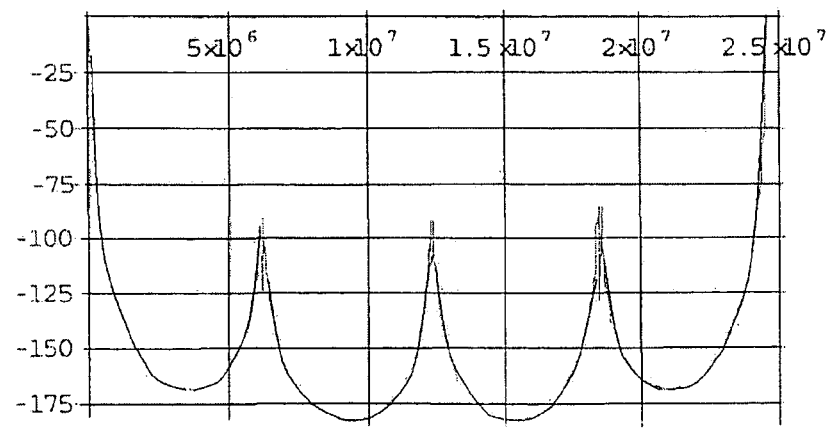
FIG. 27 illustrates the overall transfer function in FIG. 24 with the three highest degree polynomial modifiers removed.

Referring to FIGS. 19-24, these functions can be studied for simplification, while still maintaining an acceptable overall transfer function. One way to simplify things is to see if any of the polynomial inputs can be eliminated altogether. FIGS. 25-27 illustrate the overall transfer function with successive polynomial inputs removed, starting with the polynomial of highest degree in FIG. 25. (Again, "degree" refers to the curve fit through the coefficients if referenced to the discrete $z^{-1}$ domain. If referenced to the continuous-time domain, then "degree" refers to the order of the polynomial itself.) FIG. 26 illustrates the overall transfer function with the two highest degree polynomial inputs removed. FIG. 27 illustrates the overall transfer function with the three highest degree polynomial inputs removed.

Examining the transfer functions at a high level is useful because it gives a baseline for performance if any piece of the system is eliminated. For example, removing the last polynomial input will limit performance to around 140 dB attenuation (for a certain rate conversion ratio whose spectral aliases land on the high points in the transfer function). Removing the last two polynomial inputs will limit the performance to around 115 dB attenuation, and so on. (The reason for this limitation is that these plots shown the response before the conceptual downsampling—which of course will provide aliased images of the spikes all across the band). This examination is a good place to start when preparing to implement this structure in hardware. It gives baseline (i.e., best-care) performance before ever considering finite precision effects.

The frequency axis on the above plots is overstated by the amount conceptually upsampled. In other words, the upsampling will not be explicitly performed, as the integration along partial curves (multiplied by relevant sample values) will do the sample rate conversion that is needed. However, presenting the transfer functions in this upsampled space is the easiest because at this upsampled rate, the input and output are at the same rate. Without the conceptual upsampling, the input and output are at different rates, which requires yet another lever of conceptualization. (However, aliasing will occur upon downsampling.)

Figure 28:
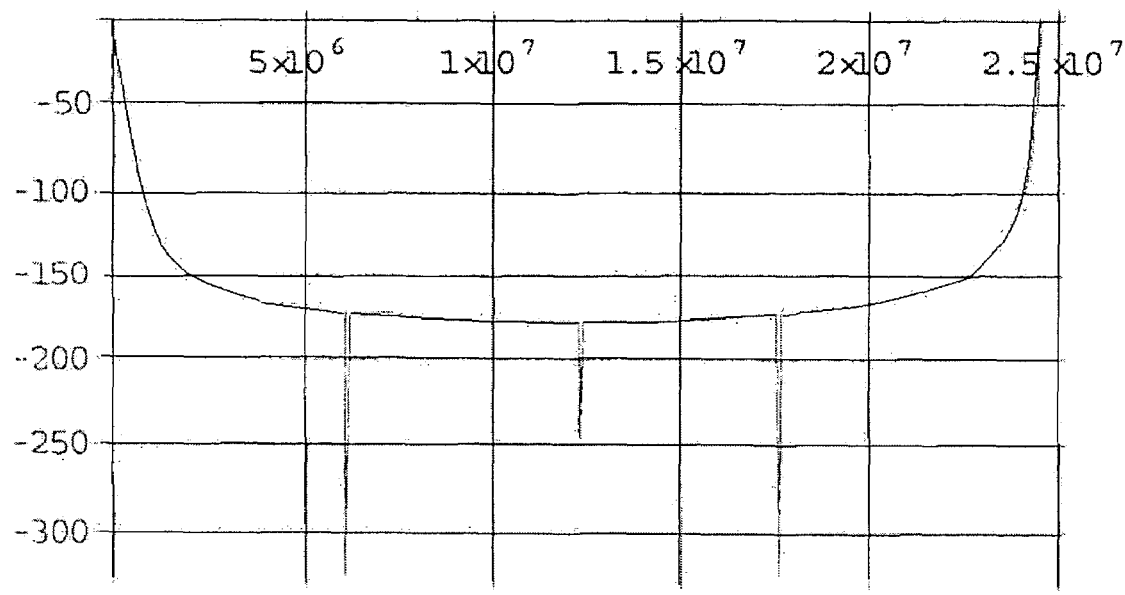
FIG. 28 illustrates overall transfer functions obtained with the feedback terms removed from A when calculating B', with three new zeros.
Figure 29:
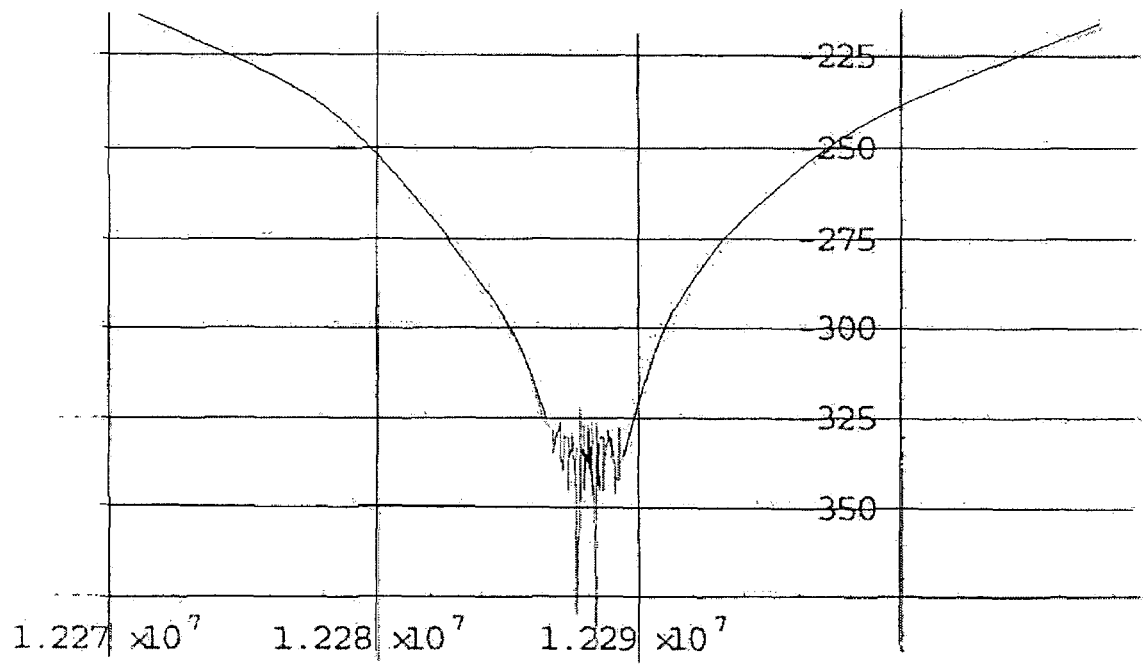
FIG. 29 illustrates the transfer function of FIG. 28 after zooming in around the center notch.

Additionally, with the feedback terms removed from A when calculating B', an overall transfer function is obtained with three new zeros as illustrated in FIG. 28. FIG. 29 illustrates this transfer function after zooming in around the center notch. In this case, calculating B' without the feedback produces the notches (compared to the flat response previously shown in FIG. 24). In other cases, calculating B' with the feedback produces notches that otherwise would not be present. From the high-level examination, the polynomial transfer functions introduce zeros, which offset the peaks in the individual state input transfer functions (when the two functions are multiplied together). Depending on the perspective, another valid way to evaluate appropriate approximations for the modification terms is to consider the placement and width of the zeros that the modification terms provide.

Finally, in working on finite precision effects, individual transfer functions can be examined separately to get baseline (i.e., best-care) performance, just as was done when eliminating pieces of the system previously.

To implement the embodiment of the present invention, one must create hardware that performs the equations:

$$X'=AX+BU$$

$$Y=CX+DU$$

$$X=z^{-1}X'$$

In particular, the equation for Y is straightforward because the filter runs at the output clock rate, (and D is 0). The equation for X', however was not initially straightforward, so a modified B' is developed, which allows X' to be updated at the output clock rate, even though the input is at a different rate.

The example here showed a 5:4 rate conversion and a 5th order IIR filter. However, neither the rate conversion ratio, nor the order of the IIR filter is constrained by this invention. Any rate conversion can be done, and different conversion rates are accomplished by different amounts of integration at each output time step. Even for a constant rate conversion ratio, the amount of integration along each curve varies with time. A control module may be used to handle this situation.

As illustrated in the examples herein, the technique of the present invention may be used to modify any low pass IIR filter with SRC modification terms to remove images that are associated with sample rate conversion—without increasing the number of states in the original filter. Any sample rate conversion involves an explicit or implicit upsampling, low pass filtering, and downsampling, and in this regard, the present invention is no different. However, in the present invention, modification terms can be added to an existing filter, which adds SRC functionality to that filter, without increasing that filter's number of states. Thus, a filter used for other filtering purposes (e.g., audio processing or the like) can also be used as a sample rate converter, without increasing the number of states of the filter.

While the preferred embodiment and various alternative embodiments of the invention have been disclosed and described in detail herein, it may be apparent to those skilled in the art that various changes in form and detail may be made therein without departing from the spirit and scope thereof.

It should be noted that the examples illustrated herein should in on way be interpreted as limited the spirit and scope of the present invention in any way. The specific examples and implementations are shown here for purposes of illustration only. And while in the preferred embodiment the number of states in the filter may remain unaltered when modified to perform sample rate conversion, in alternative embodiments, additional states may be added without departing from the spirit and scope of the present invention.

We claim:

1. A method of converting input data samples provided at a first sample rate to output data samples at a second rate unequal to the first sample rate, the first and second sample rates being either an integer multiple of one another or not an integer multiple of one another, the method comprising the steps of:

filtering, in an Infinite Impulse Response filter whose internal states are updated at the second sample rate, the input data samples to produce output data samples at the second sample rate; and when the first and second sample rates are not an integer multiple of one other, in response to a new input sample arriving at a time different from the update of the Infinite Impulse Response filter's internal states, modifying at least one internal state of the Infinite Impulse Response filter to account for the time difference.

2. A method of converting input data samples provided at a first sample rate to output data samples at a second sample rate unequal to the first sample rate, the method comprising the steps of:

filtering, in an Infinite Impulse Response filter whose internal states are updated at the second sample rate, the input data sample to produce output data samples at the second sample rate; and in response to a new input sample arriving at a time different from the update of the Infinite Impulse Response filter's internal states, modifying at least one internal state of the Infinite Impulse Response filter to account for the time difference, wherein the step of modifying comprises the step of modifying the at least one internal state in response to an amount of time elapsing between when an input data sample arrives and the update of the Infinite Response filter's internal states.

3. A method of converting input data samples provided at a first sample rate to output data samples at a second sample rate unequal to the first sample rate, the method comprising the steps of:

filtering, in an Infinite Impulse Response filter whose internal states are updated at the second sample rate, the input data samples to produce output data samples at the second sample rate; and in response to a new input sample arriving at a time different from the update of the Infinite Impulse Response filter's internal states, modifying at least one internal state of the Infinite Impulse Response filter to account for the time difference, wherein the step of modifying comprises the step of modifying the at least one internal state in response to a difference in input value before the input data sample arrives at a time different from the update of the Impulse Response filter's internal states, and the input value after the input data sample arrives at a time different from the update of the Infinite Impulse Response filter's internal states.

4. The method of claim 2, wherein the input changes value no more than once per update of the Infinite Impulse Response filter's internal states.

5. The method of claim 2, further comprising the step of interpolating input data prior to filtering to achieve a further sample rate conversion.

6. The method of claim 2, further comprising the step of decimating output data to achieve a further sample rate conversion.

7. The method of claim 2, wherein the at least one internal state comprises at least one element of vector X, vector X representing current states, vector X' representing what those states will be at the next point in time, vector U representing an input to the filter, and vector Y representing output of the filter, and matrices A, B', C, and D determine how the states variables are updated and how outputs are made from the internal states, wherein internal state descriptions are represented as $X'=AX+B'U$ $Y=CX+DU$ $X=z^{-1}X'$ wherein the B' matrix comprises a column matrix whose elements are polynomials in $z^{-1}$.

8. The method of claim 7, wherein the B' matrix comprises a column matrix whose elements are polynomials of the time difference, wherein the polynomials are of increasing degree.

9. An apparatus of converting input data samples provided at a first sample rate to output data samples at a second sample rate unequal to the first sample rate, the first and second sample rates being either an integer multiple of one another or not an integer multiple of one another, the apparatus comprising:

an Infinite Impulse Response filter whose internal states are updated at the second sample rate, filtering the input data samples to produce output data samples at the second sample rate; and when the first and second sample rates are not an integer multiple of one other, sample rate conversion compensation for modifying at least one internal state of the Infinite Impulse Response filter in response to a new input sample arriving at a time differing from the update of the Infinite Impulse Response filter's internal states, to account for the time difference.

10. An apparatus of converting input data samples provided at a first sample rate to output data samples at a second sample rate unequal to the first sample rate, the apparatus comprising:

an Infinite Impulse Response filter whose internal states are updated at the second sample rate, filtering the input data samples to produce output data samples at the second sample rate; and sample rate conversion compensation for modifying at least one internal state of the Infinite Impulse Response filter in response to a new input sample arriving at a time differing from the update of the Infinite Impulse Response filter's internal states, to account for the time difference, wherein the sample rate conversion compensation modifies the at least one internal state in response to an amount of time elapsing between when an input data sample arrives and updates of the Infinite Impulse Response filter's internal states.

11. An apparatus of converting input data samples provided at a first sample rate to output data samples at a second sample rate unequal to the first sample rate, the apparatus comprising:

an Infinite Impulse Response filter whose internal states are updated at the second sample rate, filtering the input data samples to produce output data samples at the second sample rate; and sample rate conversion compensation for modifying at least one internal state of the Infinite Impulse Response filter in response to a new input sample arriving at a time differing from the update of the Infinite Impulse Response filter's internal states, to account for the time difference, wherein the sample rater conversion modifies the at least one internal state in response to a difference in input value before the input data sample arrives at a time different from the update of the Infinite Impulse Response filter's internal states, and the input value after the input data sample arrives at a time different from the update of the Infinite Impulse Response filter's internal states.

12. The apparatus of claim 10, wherein the input changes value no more than once per update of the Infinite Impulse Response filter's internal states.

13. The apparatus of claim 10, further comprising an interpolator coupled to an input of the Infinite Impulse Response filter, for interpolating input data to achieve a further sample rate conversion.

14. The apparatus of claim 10, further comprising a decimator for decimating output data to achieve a further sample rate conversion.

15. The apparatus of claim 10, wherein the at least one internal state comprises at least one element of vector X, vector X representing current states, vector X' representing what those states will be at the next point in time, vector U representing an input to the filter, and vector Y representing output of the filter, and matrices A, B', C, and D determine how the states variables are updated and how outputs are made from the internal states, wherein internal state descriptions are represented as $$X' = AX + B'U$$

$$Y = CX + DU$$

$$X = z^{-1} X'$$

wherein the B' matrix comprises a column matrix whose elements are polynomials in $z^{-1}$.

16. The apparatus of claim 15, wherein the B' matrix comprises a column matrix whose elements are polynomials of the time difference, wherein the polynomials are of increasing degree.

17. A method of converting input data samples provided at a first sample rate to output data samples at a second sample rate unequal to the first sample rate, the first and second sample rates being either an integer multiple of one another or not an integer multiple of one another, the method comprising the steps of:

filtering, in an Infinite Impulse Response filter whose internal states are updated at the second sample rate, the input data samples to produce output data samples at the second sample rate; and when the first and second sample rates are not an integer multiple of one other, modifying at least one internal state of the Infinite Impulse Response filter, to account for the input samples changing value at times differing from the update of the Infinite Impulse Response filter's internal states.

18. A method of converting input data samples provided at a first sample rate to output data samples at a second sample rate unequal to the first sample rate, the method comprising the steps of:

filtering, in an Infinite Impulse Response filter whose internal states are updated at the second sample rate, the input data samples to produce output data samples at the second sample rate; and modifying at least one internal state of the Infinite Impulse Response filter, to account for the input samples changing value at times differing from the update of the Infinite Impulse Response filter's internal states, wherein the step of modifying comprises the step of updating the at least one internal state in response to an amount of time elapsing between when an input data sample arrives and the update of the Infinite Impulse Response filter's internal states.

19. A method of converting input data samples providing at a first sample rate to output data samples at a second sample rate unequal to the first sample rate, the method comprising the steps of:

filtering, in an Infinite Impulse Response filter whose internal states are updated at the second sample rate, the input data samples to produce output data samples at the second sample rate; and modifying at least one internal state of the Infinite Impulse Response filter, to account for the input samples changing value at times differing from the update of the Infinite Impulse Response filter's internal states, wherein the step of modifying comprises the step of updating the at least one internal state in response to a difference in input value before an input data sample changes value at a time different from the update of the Infinite Impulse Response filter's internal states, and the input value after the input data sample arrives at a time different from the update of the Infinite Impulse Response filter's internal states.

20. The method of claim 17, wherein the input changes value no more than once per update of the Infinite Impulse Response filter's internal states.

21. The method of claim 17, further comprising the step of interpolating, prior to filtering, input data to achieve a further sample rate conversion.

22. The method of claim 17, further comprising the step of decimating output data to achieve a further sample rate conversion.

23. The method of claim 18, wherein the at least one internal state comprises at least one element of vector X, vector X representing current states, vector X' representing what those states will be at the next point in time, vector U representing an input to the filter, and vector Y representing output of the filter, and matrices A, B', C, and D determine how the states variables are updated and how outputs are made from the internal states, wherein internal state descriptions are represented as $$X' = AX + B'U$$

$$Y = CX + DU$$

$$X = z^{-1} X'$$

wherein the B' matrix comprises a column matrix whose elements are polynomials in $z^{-1}$.

24. The method of claim 23, wherein the B' matrix comprises a column matrix whose elements are polynomials of the time difference, wherein the polynomials are of increasing degree.

25. An apparatus of converting input data samples provided at a first sample rate to output data samples at a second sample rate unequal to the first sample rate, the first and second sample rates being either an integer multiple of one another or not an integer multiple of one another, the apparatus comprising:

an Infinite Impulse Response filter whose internal states are updated at the second sample rate, filtering the input data samples to produce output data samples at the second sample rate; and sample rate conversion compensation for modifying at least one internal state of the Infinite Impulse Response when the first and second sample rates are not an integer multiple of one other, to account for the input samples changing value at times differing from the update of the Infinite Impulse Response filter's internal states.

26. An apparatus of converting input data samples provided at a first sample rate to output data samples at a second sample rate unequal to the first sample rate, the apparatus comprising:

an Infinite Impulse Response filter whose internal states are updated at the second sample rate, filtering the input data samples to produce output data samples at the second sample rate; and sample rate conversion compensation for modifying at least one internal state of the Infinite Impulse Response to account for the input samples changing value at times differing from the update of the Infinite Impulse Response filter's internal states, wherein the sample rate conversion compensation modifies the at least one internal state in response to an amount of time elapsing between when an input data sample arrives and updates of the Infinite Impulse Response filter's internal states.

27. An apparatus of converting input data samples provided at a first sample rate to output data samples at a second sample rate unequal to the first sample rate, the apparatus comprising:

an Infinite Impulse Response filter whose internal states are updated at the second sample rate, filtering the input data samples to produce output data samples at the second sample rate; and sample rate conversion compensation for modifying at least one internal state of the Infinite Impulse Response to account for the input samples changing value at times differing from the update of the Infinite Impulse Response filter's internal states, wherein the sample rate conversion compensation modifies the at least one internal state in response to a difference in input value before the input data sample arrives at a time different from the update of the Infinite Impulse Response filter's internal states, the input value after an input sample changes value at a time differing from the update of the Infinite Impulse Response filter's internal states.

28. The apparatus of claim 26, wherein the input changes value no more than once per update of the Infinite Impulse Response filter's internal states.

29. The apparatus of claim 26, further comprising an interpolator coupled to an input of the Infinite Impulse Response filter, for interpolating input data to achieve a further sample rate conversion.

30. The apparatus of claim 26, further comprising a decimator for decimating output data to achieve a further sample rate conversion.

31. The apparatus of claim 26, wherein the at least one internal state comprises at least one element of vector X, vector X representing current states, vector X' representing what those states will be at the next point in time, vector U representing an input to the filter, and vector Y representing output of the filter, and matrices A, B', C, and D determine how the states variables are updated and how outputs are made from the internal states, wherein internal state descriptions are represented as $$X' = AX + B'U$$

$$Y = CX + DU$$

$$X = z^{-1}X'$$

wherein the B' matrix comprises a column matrix whose elements are polynomials in $z^{-1}$.

32. The apparatus of claim 31, wherein the B' matrix comprises a column matrix whose elements are polynomials of the time difference, wherein the polynomials are of increasing degree.

33. The method of claim 3, wherein the input changes value no more than once per update of the Infinite Impulse Response filter's internal states.

34. The method of claim 3, further comprising the step of interpolating input data prior to filtering to achieve a further sample rate conversion.

35. The method of claim 3, further comprising the step of decimating output data to achieve a further sample rate conversion.

36. The apparatus of claim 11, wherein the input changes value no more than once per update of the Infinite Impulse Response filter's internal states.

37. The apparatus of claim 11, further comprising an interpolator coupled to an input of the Infinite Impulse Response filter, for interpolating input data to achieve a further sample rate conversion.

38. The apparatus of claim 11, further comprising a decimator for decimating output data to achieve a further sample rate conversion.

39. The method of claim 18, wherein the input changes value no more than once per update of the Infinite Impulse Response filter's internal states.

40. The method of claim 18, further comprising the step of interpolating, prior to filtering, input data to achieve a further sample rate conversion.

41. The method of claim 18, further comprising the step of decimating output data to achieve a further sample rate conversion.

42. The apparatus of claim 26, wherein the input changes value no more than once per update of the Infinite Impulse Response filter's internal states.

43. The apparatus of claim 26, further comprising an interpolator coupled to an input of the Infinite Impulse Response filter, for interpolating input data to achieve a further sample rate conversion.

44. The apparatus of claim 26, further comprising a decimator for decimating output data to achieve a further sample rate conversion.

* * * * *